United States Patent
Taguchi et al.

(10) Patent No.: US 6,736,907 B2
(45) Date of Patent: May 18, 2004

(54) SOLDER PASTE

(75) Inventors: Toshihiko Taguchi, Saitama (JP); Kunihito Takaura, Mouka (JP); Masahiko Hirata, Kashiba (JP); Hisahiko Yoshida, Ibaraki (JP); Takashi Nagashima, Kyoto (JP)

(73) Assignees: Senju Metal Industry Co., Ltd., Tokyo (JP); Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/308,167

(22) Filed: Dec. 3, 2002

(65) Prior Publication Data

US 2003/0121564 A1 Jul. 3, 2003

(30) Foreign Application Priority Data

Dec. 7, 2001 (JP) .................................. 2001-374752

(51) Int. Cl.⁷ .................... B23K 35/363; B23K 35/365

(52) U.S. Cl. ............................................ 148/23; 148/24

(58) Field of Search ...................................... 148/23, 24

(56) References Cited

U.S. PATENT DOCUMENTS 6,059,894 A * 5/2000 Pendse ........................ 148/23

* cited by examiner

Primary Examiner—Daniel Jenkins
(74) Attorney, Agent, or Firm—Michael Tobias

(57) ABSTRACT

A lead-free solder paste comprises an Sn—Zn based lead-free solder powder mixed with a flux. The flux contains at least one aromatic hydroxycarboxylic acid selected from the group consisting of aromatic carboxylic acids having one hydroxyl group in a meta position (such as 3-hydroxy-2-methylbenzoic acid) and aromatic carboxylic acids having at least two hydroxyl groups (such as dihydroxynaphthoic acid or dihydroxybenzoic acid) in an amount of 0.1–10.0 mass %. The flux may further include 0.5–20 mass % of an aliphatic hydroxy carboxylic acid (such as hydroxyoleic acid).

7 Claims, No Drawings

SOLDER PASTE

BACKGROUND OF THE INVENTION

1. Field of the Invention

This invention relates to a solder paste used for soldering of electronic equipment, and in particular it relates to a lead-free solder paste using an Sn—Zn based lead-free solder.

2. Description of the Related Art

From ancient times, an Sn—Pb based alloy has been used as solder. An Sn—Pb alloy has the advantages that it has a low melting point and it has good solderability. For example, an Sn63%-Pb37% alloy which is a eutectic composition and is the most typical solder, has a melting point of 183° C., and soldering can be carried out at a temperature on the order of 200–230° C.

This eutectic Sn—Pb solder has been generally used in the past for soldering of electronic equipment. Mounting of electronic parts on printed circuit boards has recently come to be widely carried out by surface mount technology (SMT) because it permits reductions in size, a higher density, higher performance, and lower costs.

In SMT, a solder paste (also called cream solder) which comprises solder powder uniformly mixed with a soldering flux, and particularly a rosin flux, is used. Typically, soldering is carried out by reflow soldering. In general, in reflow soldering, a solder paste is supplied to a printed circuit board by printing or dispensing, a chip-type electronic part is temporarily secured thereon utilizing the adhesion of the solder paste, the entire printed circuit board is heated in a reflow furnace to melt the solder and thus perform securing and connection of the part to the printed circuit board. Accordingly, the electronic part to be mounted is also exposed to the soldering temperature in reflow soldering. When a eutectic Sn—Pb solder is used, since the soldering temperature is relatively low as described above, thermal damage of electronic parts does not take place easily even with reflow soldering, which involves heating of the parts.

The development of electronic equipment is rapid, and large quantities thereof are discarded. Printed circuit boards which are removed from disassembled discarded electronic equipment are often shredded and then disposed of by burial underground. If rain water which has become acidified in recent years (acid rain) contacts shredded printed circuit boards which have been disposed of by burial underground, the lead constituent in the Sn—Pb solder is dissolved out as lead ions, which pollutes underground water. If humans or animals drink water containing lead ions over long periods, the lead ions accumulates in their bodies, and there is concern over lead poisoning occurring. Therefore, the use of lead-free solder which does not contain any lead has come to be recommended for soldering of the electronic equipment.

It is desired that a lead-free solder be an alloy constituted by elements that are harmless to the human body. For example, Cd which is harmful cannot be used even though it has an effect of lowering the melting point. Lead-free solders which are promising at present are Sn based alloys which have Sn as a main constituent to which one or more alloying elements such as Ag, Cu, Bi, In, Sb, and Zn are added.

Among such lead-free solders, Sn based alloys containing Ag such as Sn—Ag alloys and Sn—Ag—Cu alloys (referred to below as Sn—Ag based solders collectively) are advantageous in that they are easy to use since they have good wettability among lead-free solders. However, Sn—Ag based lead-free solders have a melting point of around 220° C., which is approximately 30–40° C. higher than that of an Sn—Pb eutectic solder, so the soldering temperature increases by that amount, and it exceeds a temperature of 250° C. Therefore, Sn—Ag based solders cannot be used for reflow soldering of some electronic parts which are heat sensitive. Thus, as far as reflow soldering is concerned, Sn—Ag based solders can not be described as general purpose solders.

Another Sn-based solder which contains Zn (referred to below as an Sn—Zn based solder) is known as a lead-free solder having a lower melting point. Zn is a metal which is indispensable to and therefore harmless to the human body, there is an ample resources therefor, and it is an inexpensive metal compared to Ag, Cu, Bi, In, and the like. Therefore, an Sn—Zn based solder is advantageous from the standpoints of safety and economy. A representative composition of an Sn—Zn based lead-free solder is Sn-9Zn. This alloy has a melting point of 199° C., which is approximately 20° C. lower than the melting point of an Sn—Ag based lead-free solder. Thus, it can be used in reflow soldering of heat sensitive electronic parts, with which an Sn—Ag based lead-free solder cannot be used. Furthermore, since the melting point of 199° C. of the Sn-9Zn alloy is near the melting point (183° C.) of an Sn—Pb eutectic alloy, it has another advantage that it can be used for reflow soldering using an existing reflow furnace designed for use with an Sn—Pb based solder paste.

However, an Sn—Zn based lead-free solder has extremely poor wettability compared to an Sn—Ag based lead-free solder, and soldering defects in the form of voids and solder balls can easily form. This is because Zn is a metal which has a high ionization tendency and which is hence very susceptible to oxidation. Thus, the Zn which is present on the solder surface is oxidized by contact with air, and an inactive oxide layer is formed on the solder surface.

In particular, in solder paste, solder is in the form of a powder having a large surface area, and the effect of surface oxidation is marked. Furthermore, a soldering flux, which is mixed with the solder powder to form the solder paste, contains reactive components such as an activator, which may also cause oxidation of the solder powder and make the surface oxidation of solder powder severer. Therefore, a solder paste of Sn—Zn based solder has extremely poor wettability of solder, and adequate solderability is not obtained therewith.

As a countermeasure, in order to improve wettability of such solder paste, it is conceivable to increase the amount of the activator component of the flux in a solder paste. However, in this case, the viscosity of the solder paste can easily increase due to reaction of the solder powder in the solder paste with the activator component in the flux, and the viscosity of the solder paste increases prematurely, and the supply of solder paste by printing or dispensing no longer proceeds smoothly.

Therefore, with an Sn—Zn based solder paste, in order to improve solder wettability, a method has been proposed in the past in which an Sn—Zn based solder powder is coated with a suitable material before being mixed with a flux so as to prevent the solder powder from reacting with flux and undergoing surface oxidation. As the coating material, a precious metal such as Au or Pd, an inorganic oxide formed from a hydrolyzable organosilicon compound or the like, or an organic material such as an imidazole or triazole compound can be used.

However, a coating for a solder powder as described above enormously increases the manufacturing costs of solder paste. In addition, depending on the type or method of coating, oxidation of the solder powder may be promoted during the coating operation, so coating is not necessarily effective for improving the wettability or solderability of an Sn—Zn based solder paste.

SUMMARY OF THE INVENTION

Accordingly, an object of this invention is to provide a solder paste of an Sn—Zn based solder which has good solder wettability and solderability without pretreatment of a solder powder such as coating.

A solder paste used in SMT is made by mixing a solder powder and a soldering flux. A typical flux for solder paste is a rosin flux which is formed by dissolving a rosin as a main component together with additives such as an activator, a thixotropic agent, and the like in a solvent. A flux is required to have highly reliable insulating properties and corrosion resistance. In particular, the selection of an activator which has a large effect on wettability of solder largely influences the reliability of flux. If too much wettability is desired and hence an activator is selected which is strongly active but has poor reliability, the reliability of the solder paste worsens.

In general, an Sn-based lead-free solder has poor wettability compared to an Sn—Pb based solder. For example, the spreading factor of an Sn—Ag based lead-free solder is at the level of approximately 80% the spreading factor of an Sn—Pb based solder, and the spreading factor of an Sn—Zn based lead-free solder is a still poorer value of approximately 70%.

Therefore, with a flux for a solder paste of a lead-free solder, it was necessary to incorporate an increased amount of an activator having a strong effect on improving wettability compared to a flux for an Sn—Pb based solder paste. However, with a solder paste using an Sn—Zn based lead-free solder, even if a flux is employed in which an increased amount of an activator having a strong effect on improving wettability is incorporated, the wettability is not nearly as good as that of a solder paste of an Sn—Ag based lead-free solder.

In reflow soldering using solder paste, soldering is carried out in a heating furnace called a reflow furnace. Heating in a typical reflow furnace is usually a two-stage heating method in which preheating is first carried out at a temperature of 150–170° C. for 30–100 seconds, and main heating is then carried out at a temperature 20–50° C. higher than the melting point of the solder to melt the solder and perform soldering. Preheating is carried out in order to vaporize solvents in the solder paste and at the same time to alleviate heat shock to electronic parts which have been mounted on a printed circuit board for soldering.

The flux composition used in solder paste of an Sn—Pb eutectic solder which is still most common is designed so as to exhibit optimal performance in such two-stage heating. For example, the activator in the flux is designed so that part of the activator starts to react at the preheating temperature of around 150° C., and it completely acts at the main heating temperature of an Sn—Pb based solder of around 200–230° C.

With a solder paste of an Sn—Pb based solder, due to the low reactivity of Pb, even if an activator is used which begins to activate at a low temperature of around 150° C., there is almost no occurrence of oxidation of the solder powder at the time of preheating.

In contrast, with a solder paste of an Sn—Zn based lead-free solder, it has been found that at the temperature in the preheating stage of around 150° C., the Zn on the surface of the solder powder easily combines with oxygen in the reflow furnace so that the surface of the solder powder readily oxidizes. If solder powder oxidizes during the preheating stage, the solder powder melts with its surface covered by an oxide film, and it remains as solder balls without spreading. In addition, a considerable part of the flux is consumed by reaction with the oxide layer on the surface of the solder powder, thereby causing the flux activity to weaken. As a result, the solder wettability decreases, and voids are formed in the interior of the resulting soldered joints. The solder balls and voids become a source of solder defects.

As already stated, Zn has a high ionization tendency, and it is extremely susceptible to oxidation. Thus, in general, an Sn—Zn based lead-free solder readily undergoes surface oxidation. In particular, in a solder paste, the solder alloy is in the form of a powder, and its surface area is extremely large. Therefore, with a solder paste of an Sn—Zn based solder, it is thought that the oxidation of solder in the preheating stage becomes severe, which has a marked adverse effect on solderability.

Oxidation of an Sn—Zn based solder powder in the preheating stage can be prevented by completely excluding oxygen from an atmosphere, as can be achieved with an $N_2$ reflow furnace. However, an $N_2$ reflow furnace is expensive, and its running costs are also high.

The present inventors found that if a certain aromatic hydroxycarboxylic acid is added, preferably along with an aliphatic hydroxycarboxylic acid, to a flux which is mixed with an Sn—Zn based solder powder to form solder paste, oxidation of the Sn—Zn based solder powder during preheating can be effectively prevented, and a solder paste of an Sn—Zn based solder having excellent solderability is obtained.

The present invention provides a lead-free solder paste comprising an Sn—Zn based lead-free solder powder mixed with a flux, wherein the flux contains at least one aromatic hydroxycarboxylic acid selected from the group consisting of aromatic carboxylic acids having one hydroxyl group in a meta position and aromatic carboxylic acids having at least two hydroxyl groups in an amount of 0.1–10.0 mass %.

The flux preferably further contains an aliphatic hydroxycarboxylic acid having at least 6 carbon atoms in an amount of 0.5–20 mass %, whereby solder spreadability is further increased.

DESCRIPTION OF PREFERRED EMBODIMENTS

A lead-free solder paste according to this invention is characterized in that the solder powder is a powder of an Sn—Zn based solder having a low melting point and the flux contains a certain aromatic hydroxycarboxylic acid.

A hydrohalide salt (e.g., a hydrochloride or hydrobromide salt of an amine) is effective in order to prevent oxidation of solder powder in a solder paste. This type of salt is usually added as an activator to a flux for a solder paste to obtain an activated flux. However, a hydrohalide salt becomes a source of corrosion, and hence it tends to decrease the reliability of soldering. In addition, although a hydrohalide salt has a high anti-oxidizing effect on solder powder in a solder paste, it reacts with solder powder almost instantaneously. As a result, even if an oxide film formed on the surface of solder powder is removed for a time by reacting with such a salt, the salt is no longer active when further oxidation of the solder powder occurs subsequently. Thus, in the case of an Sn—Zn based solder powder which is highly susceptible to oxidation, the solder powder ends up reoxidizing, thereby causing the formation of solder balls.

In contrast, when an aromatic hydroxycarboxylic acid having a hydroxyl group in a meta position or having two or more hydroxyl groups is added to a flux for a solder paste according to the present invention, it continuously reacts with solder powder over a wide range of temperature from a low temperature region of around 130° C. to a high temperature region of around 190° C., and it exhibits a strong effect of removing oxide films. This is thought to be because this type of aromatic hydroxycarboxylic acid has a wider reactive temperature range compared to other activators for flux, and it continuously reacts with solder powder over a wide temperature range and exhibits the effect of preventing reoxidation of the surface of solder powder. This type of aromatic hydroxycarboxylic acid does not decompose even during relatively long preheating with a heating temperature of 150–170° C. and a heating time of 100–120 seconds.

An aromatic hydroxycarboxylic acid used in the present invention is a compound having one hydroxyl group bonded to a benzene ring in a meta position with respect to a carboxyl group or having two or more hydroxyl groups in arbitrary positions with respect to a carboxyl group, and it may have one or more other substituent groups (such as an alkyl, halogen, or amino) in other positions.

Non-limiting examples of aromatic hydroxycarboxylic acids having a hydroxyl group in a meta position which are suitable for use in the present invention include 3-hydroxy-2-methylbenzoic acid, 3-hydroxy-4-methylbenzoic acid, 3-hydroxy-2,4,6-tribromobenzoic acid, 3-hydroxy-2-aminobenzoic acid, and 3-hydroxybenzoic acid. Non-limiting examples of aromatic hydroxycarboxylic acids having at least two hydroxyl groups which are suitable for use in the present invention include dihydroxybenzoic acids, dihydroxycinnamic acids, dihydroxynaphthoic acids, gallic acid, and dihydroxyphenylacetic acids. One or more of such aromatic hydroxycarboxylic acids can be used.

When a flux containing the above-described aromatic hydroxycarboxylic acid is used to prepare a solder paste of an Sn—Zn based solder, a solder paste is obtained which is improved not only with respect to formation of solder balls but which also has improved wettability.

In order to allow the surface of the substrate to be wetted by solder which has melted during reflowing, it is necessary to remove an oxide film of the solder by reaction with flux. Soldering defects of an Sn—Zn based solder caused by oxidation are primarily manifested by the formation of solder balls because wetting of the substrate by the molten solder is impeded by the oxide film. However, soldering defects of an Sn—Zn based solder caused by oxidation are not limited to this, and they can also occur while the solder is about to spread over the substrate after the substrate has been wetted by solder during reflowing. Since Zn is a metal which oxidizes very readily, the oxidation of the surface of the molten solder progresses even while the solder is spreading on a substrate after the substrate has been wetted by solder, and the spreadability of the solder is impeded. As a result, the spreading factor of an Sn—Zn based solder is low compared to other lead-free solders, and the solder does not adequately spread.

The present inventors discovered that coexistence of an aliphatic hydroxycarboxylic acid having at least 6 carbon atoms with the above-described aromatic hydroxycarboxylic acid in a flux is effective against oxidation of an Sn—Zn based solder occurring at the time when molten solder is about to spread after the solder has wet a substrate. Here, the aliphatic hydroxycarboxylic acid is an aliphatic compound having at least one hydroxyl group and at least one carboxyl group. The aliphatic hydroxycarboxylic acid is preferably a compound which does not contain functional groups other than hydroxyl groups or carboxyl groups, but a compound containing one or more other functional groups may be used.

Although it is not intended to be bound by any theory, it is conjectured that the above-described effects of an aliphatic carboxylic acid are produced by the following mechanism. An aliphatic hydroxycarboxylic acid having at least 6 carbon atoms has a decomposition temperature of 200° C. or higher, so it produces a reaction at a relatively high temperature. Therefore, when soldering of a solder paste is carried out in a reflow furnace, this compound hardly contributes to the reaction in the preheating stage, and it is maintained in an unreacted state until the final stage in which the flux and the solder powder react. After the substrate is wet by the solder, when the solder is about to spread, this compound exhibits an anti-oxidizing effect on Sn—Zn based solder. By using an aliphatic hydroxycarboxylic acid which in this manner has an anti-oxidizing effect at the final spreading stage together with an aromatic hydroxycarboxylic acid which has an anti-oxidizing effect on Sn—Zn based solder starting from the initial preheating stage before melting, oxidation of solder is prevented from a point before melting and wetting to the final point of spreading, and the spreadability of Sn—Zn based solder is improved.

The aliphatic hydroxycarboxylic acid which is used is one having at least 6 carbon atoms. An aliphatic hydroxycarboxylic acid having less than 6 carbon atoms does not have adequate heat resistance, and it may decompose by the time the temperature in the reflow furnace reaches the main heating temperature, so the above-described effects cannot be exhibited. There is no particular upper limit on the number of carbon atoms in the aliphatic hydroxycarboxylic acid, but preferably it is a compound having at most 18 carbon atoms. If the number of carbon atoms exceeds 18, there is a tendency for the anti-oxidizing effect after solder spreading to weaken.

Non-limiting examples of aliphatic hydroxycarboxylic acids suitable for use in the present invention include hydroxyoctadecanoic acid, hydroxyoleic acid, hydroxyoctanoic acid, and dihydroxyoctadecanoic acid. It is also possible to use other compounds. One or more aliphatic hydroxycarboxylic acids can be used.

In order to adequately obtain the above-described effect, a flux used in a solder paste according to the present invention contains the above-described aromatic hydroxycarboxylic acid in an amount of 0.1–10.0 mass %. When an aliphatic hydroxycarboxylic acid is added therewith, the amount of the aliphatic hydroxycarboxylic acid which is added is in the range of 0.5–20 mass %.

If the amount of either compound which is added to a flux is too small, the desired effect is not obtained appreciably. If the amount is too large, solderability is impeded, leading to an increase in solder balls and a decrease in spreadability. A preferred amount is 0.5–5 mass % for the aromatic hydroxycarboxylic acid and 1–10 mass % for the aliphatic hydroxycarboxylic acid.

A flux used in a solder paste according to the present invention is preferably a rosin flux having rosin as a main component. Except for the characteristic of the present invention that is the addition of the above-described aromatic hydroxycarboxylic acid by itself or along with the above-described aliphatic hydroxycarboxylic acid, the composition of the flux may be the same as a conventional one.

In addition to rosin which is the main component, a rosin flux normally contains an activator, a thixotropic agent, a solvent, and the like. The rosin may be a natural, unmodified rosin such as a gum rosin, a tall oil rosin, a wood rosin, or the like, or it may be a modified rosin such as a polymerized rosin, a hydrogenated rosin, a rosin ester, a rosin modified resin, or the like. Of course, two or more of these may be used in combination.

As the activator, it is preferable to use a hydrohalide and particularly a hydrobromide of an organic amine. The organic amine may be a primary (such as ethylamine), secondary (such as diethylamine), or tertiary amine (such as triethylamine). Heterocyclic amines such as pyridine, aromatic amines such as aniline, alicyclic amines such as cyclohyexylamine, and compounds having two or more amino groups such as diphenylguanidine may also be used. In addition to these activators, it is possible to use other activators such as stearic acid, sebacic acid, or other organic acids.

Hardened castor oil, amides, and the like are typically used as a thixotropic agent. Some examples of a solvent are carbitols such as butylcarbitol and hexylcarbitol, and alcohols such as terpineol and halogenated alcohols. The flux may contain one or more other additives in addition to the above.

There is no particular limit on the amount of the above components in the flux, but typically, in mass %, the rosin is approximately 35–60%, the activator is approximately 0.5–10%, and the thixotropic agent is approximately 1–10%. The amount of an amine hydrohalide as an activator is preferably 0.5–5%. In addition, the flux contains the above-described aromatic hydroxycarboxylic acid and optionally an aliphatic hydroxycarboxylic acid according to the present invention.

An Sn—Zn based lead-free solder used in a solder paste according to the present invention includes an Sn—Zn alloy containing Sn and around 9 mass % (e.g., 7–11 mass %) of Zn and having a melting point of around 200° C., or an Sn—Zn based alloy in which one or more of Bi, In Ag, Ni, Co, Mo, Fe, P, Ge, Ga, or the like is added to this Sn—Zn alloy with the object of further decreasing the melting temperature, improving mechanical strength, or suppressing oxidation. A preferred example of an Sn—Zn based solder is an Sn-8% Zn-3% Bi alloy.

There is no particular limitation on the form of the solder powder, but normally it is a spherical powder. It can be prepared by the centrifugal atomizing method or the gas atomizing method or the like. The particle size of the solder powder may be the same as for a conventional solder paste and is usually on the order of 200–400 mesh, but powder which is 500 mesh or finer may also be used.

The mixing ratio of the Sn—Zn based solder powder and the flux may be selected so as to obtain a solder paste having a consistency suitable for printing or dispensing. Normally, the flux is 5–20 mass %, and the remainder is solder powder.

A solder paste using an Sn—Zn based lead-free solder has the industrial advantages that the melting point of the solder is close to that of a usual Sn—Pb based solder. Thus, it can be used in the soldering of electronic parts having high sensitivity to heat, and existing reflow equipment designed for use with an Sn—Pb bases solder can be used without modification. However, in a conventional solder paste of this type, since the solder powder contains Zn which readily reacts with flux, oxidation of the solder surface takes place during preheating and main heating in a reflow furnace, leading a decrease in wettability and causing the formation of solder balls during soldering and worsening spreadability of solder, and use thereof was difficult.

By using a solder paste of an Sn—Zn based lead-free solder according to the present invention, the above-described oxidation of the solder surface is effectively prevented. Thus, although the solder contains Zn, soldering can be performed in a stable manner without coating of solder powder, the occurrence of solder balls is reduced or eliminated, and the spreadability of solder is markedly improved. Accordingly, the present invention provides technology facilitating to industrially carry out lead-free soldering by a reflow method using an Sn—Zn based solder, and it also contributes to preventing lead pollution of underground water by solder.

EXAMPLES

In mass percent, 88.5% of a spherical powder of an Sn—Zn based lead-free solder alloy having a composition of 8% Zn-3% Bi—Sn (balance) was uniformly mixed with 11.5% of a rosin flux having the composition shown in Table 1 to prepare a solder paste of an example or a comparative example.

The solder paste was used to perform screen printing on the surface of Cu wiring on a typical glass epoxy printed circuit board and subjected to a reflow test in a reflow furnace in which preheating and main heating were carried out under the same conditions as for a conventional Sn—Pb based solder paste, in order to evaluate with respect to the formation of solder balls and spreadability.

TABLE 1

| Flux components (the figure(s) of each component indicates mass %) | Example No. | | | | Comparative Example No. | |
|---|---|---|---|---|---|---|
| | 1 | 2 | 3 | 4 | 1 | 2 |
| Polymerized rosin | 44 | 39 | 43 | 38 | 46 | 41 |
| Diphenylguanidine HBr | 2 | 2 | 2 | 2 | 2 | 2 |
| Hardened castor oil | 5 | 5 | 5 | 5 | 5 | 5 |
| 2,3-dibromo-1-propanol | 2 | 2 | 2 | 2 | 2 | 2 |
| α-terpineol | 45 | 45 | 45 | 43 | 45 | 45 |
| 2,6-dihydroxynaphthoic acid | 2 | 2 | — | — | — | — |
| 2,6-dihydroxybenzoic acid | — | — | — | 2 | — | — |
| 3-hydroxy-2-methylbenzoic acid | — | — | 3 | 3 | — | — |
| 12-hydroxyoleic acid | — | 5 | — | 5 | — | 5 |
| Formation of solder balls | none | none | none | none | many | many |
| Solder spreadability | good | excellent | good | excellent | poor | poor |

As can be seen from Table 1, with the solder paste of the Sn—Zn based solder of Comparative Example 1 corresponding to a conventional rosin flux containing diphenylguanidine hydrobromide as an activator, many solder balls were formed during soldering, and the solder spreadability was also poor.

In contrast, according to the present invention, in Examples 1–4 of a solder paste of an Sn—Zn based solder in which an aromatic hydroxycarboxylic acid having at least two hydroxyl groups (2,6-dihydroxynaphthoic acid or 2,6-dihydroxybenzoic acid) and/or an aromatic hydroxycarboxlyic acid having a hydroxyl group in a meta position (3-hydroxy-2-methylbenzoic acid) was added to a flux, the formation of solder balls was prevented, and solder spreadability was improved. In particular, in the solder pastes of Examples 2 and 4 in which an aliphatic hydroxycarboxylic acid (12-hydroxyoleic acid) was added to a flux in addition to the aromatic hydroxycarboxylic acid, the spreadability was even further improved.

However, as shown by Comparative Example 2, with the addition of an aliphatic hydroxycarboxylic acid alone, many solder balls were formed, and the solder spreadability was also poor, so no substantial improvement was recognized.

What is claimed is:

1. A lead-flee solder paste comprising an Sn—Zn based lead-free solder powder mixed with a flux, wherein the flux contains at least one aromatic hydroxycarboxylic acid selected from the group consisting of aromatic carboxylic acids having one hydroxyl group in a meta position and aromatic carboxylic acids having at least two hydroxyl groups in an amount of 0.1–10.0 mass %.

2. A lead-free solder paste as set forth in claim 1 wherein the flux further contains an aliphatic hydroxycarboxylic acid having at least 6 carbon atoms in an amount of 0.5–20 mass %.

3. A lead-free solder paste as set forth in claim 1 wherein the Sn—Zn based lead-free solder powder is an Sn—Zn alloy containing 7–11 mass % Zn.

4. A lead-free solder paste as set forth in claim 1 wherein the Sn—Zn based lead-free solder powder is an Sn—Zn alloy containing 7–11 mass % Zn to which one or more elements selected from the group consisting of Bi, In, Ag, Ni, Co, Mo, Fe, P, Ge and Ga are added.

5. A lead-free solder paste as set forth in claim 4 wherein the Sn—Zn based lead-free solder powder is in Sn-8% Zn-3% Bi alloy.

6. A lead-free solder paste as set forth in claim 1 wherein the flux is a rosin-based flux.

7. A lead-free solder paste as set forth in claim 6 wherein the rosin-based flux further contains an activator and a thixotropic agent.

* * * * *